(12) United States Patent
Kudo (10) Patent No.: US 9,418,720 B1
(45) Date of Patent: Aug. 16, 2016

(54) PATTERN MATCHING DEVICE

(71) Applicant: KABUSHIKI KAISHA TOSHIBA, Minato-ku (JP)

(72) Inventor: Kiwamu Kudo, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/007,470

(22) Filed: Jan. 27, 2016

(30) Foreign Application Priority Data

Mar. 4, 2015 (JP) ................. 2015-042929

(51) Int. Cl.
*G11C 11/00* (2006.01)
*G11C 11/16* (2006.01)

(52) U.S. Cl.
CPC ............ *G11C 11/161* (2013.01); *G11C 11/165* (2013.01)

(58) Field of Classification Search
CPC ........................................................ G11C 11/00
USPC ......................................................... 365/158
See application file for complete search history.

(56) References Cited

U.S. PATENT DOCUMENTS

| | | | | |
|---|---|---|---|---|
| 7,795,984 B2 * | 9/2010 | Xi | ........................ | H03B 15/006 331/187 |
| 8,194,361 B2 * | 6/2012 | Kudo | ..................... | B82Y 25/00 360/324.11 |
| 8,208,295 B2 * | 6/2012 | Dieny | .................... | B82Y 25/00 365/158 |
| 2014/0092664 A1 | 4/2014 | Bourianoff et al. | | |

FOREIGN PATENT DOCUMENTS

JP        2010-206023         9/2010

OTHER PUBLICATIONS

Mehdi Kabir, et al., "Computing with Hybrid CMOS/STO Circuits", DAC '14, Proceedings of the 51st Annual Design Automation Conference, 2014, 8 pages.
Gyorgy Csaba, et al., "Computational Study of Spin-Torque Oscillator Interactions for Non-Boolean Computing Applications", IEEE Transactions on Magnetics, vol. 49, No. 7, Jul. 2013, pp. 4447-4451.
Tadashi Shibata, et al., "CMOS Supporting Circuitries for Nano-Oscillator-Based Associative Memories", IEEE, Cellular Nanoscale Networks and Their Applications (CNNA), 2012 13th International Workshop on, 2012, 6 pages.

* cited by examiner

*Primary Examiner* — Harry W Byrne
(74) *Attorney, Agent, or Firm* — Oblon, McClelland, Maier & Neustadt, L.L.P.

(57) ABSTRACT

According to an embodiment, a pattern matching device includes unit cells, a circuit, and a measuring unit. Each unit cell includes a first magnetization reversal element used to store input data and including a first magnetic layer in which a direction of magnetization is variable, a second magnetization reversal element used to store template data and including a second magnetic layer in which a direction of magnetization is variable, and a spin-torque oscillator provided therebetween. The circuit applies a current to a selected spin-torque oscillator to acquire a high frequency signal from the selected spin-torque oscillator. The measuring unit measures a degree of matching between the input data and the template data based on the high frequency signal.

8 Claims, 5 Drawing Sheets

PATTERN MATCHING DEVICE

CROSS-REFERENCE TO RELATED APPLICATIONS

This application is based upon and claims the benefit of priority from Japanese Patent Application No. 2015-042929, filed Mar. 4, 2015, the entire contents of which are incorporated herein by reference.

FIELD

Embodiments described herein relate generally to a pattern matching device using spin-torque oscillators.

BACKGROUND

For the past 40 years, semiconductor industries have developed owing to highly integrated Si-based CMOSs (Complementary Metal-Oxide Semiconductors). However, further promoting higher integration of CMOS is expected to be become difficult due to economic and technological limits of miniaturizing techniques. Thus, a concept "Beyond CMOS", which refers to creating new devices that are not bound by the concept of transistors, has surfaced as a next-generation device development concept.

In such a technical orientation, efforts have been made to construct hardware that performs pattern matching on data (for example, image data, speech data, and text data) using oscillators. This technique involves operating the oscillators in parallel to match input data against template data, and is thus expected to enable pattern matching to be achieved more quickly with lower power consumption than conventional software-based pattern matching implementations.

Techniques for a pattern matching device using spin-toque oscillators (STOs) are disclosed in (1) Mehdi Kabir & Mircea Stan, "Computing with Hybrid CMOS/STO Circuits", Proceeding DAC '14 Proceedings of the 51st Annual Design Automation Conference on Design Automation Conference, Pages 1-6, (2) Csaba, G. & Porod, W., "Computational Study of Spin-Torque Oscillator Interactions for Non-Boolean Computing Applications", IEEE Transactions on Magnetics, Vol. 49, No. 7, July 2013, and (3) Tadashi Shibata, Renyuan Zhang, Steven P. Levitan, Dmitri Nikonov and George Bourianoff, "CMOS Supporting Circuitries for Nano-Oscillator-Based Associative Memories", Cellular Nanoscale Networks and Their Applications (CNNA), 2012 13th International Workshop on, Date of Conference: 29-31 Aug. 2012 Page(s): 1-5. The spin-torque oscillators are sometimes referred to as spin-torque nano-oscillators (STNOs). STOs are minute oscillators of several tens of nanometers in size that can be highly integrated. The disclosed pattern matching device has a device structure in which a plurality of STOs are electrically connected together and can simultaneously oscillate. An output from the device is an averaged output resulting from totaling, through an averager, of outputs from STOs. A difference between input data (input vector) and template data (template vector) is input to the device to allow the oscillation frequencies of the STOs to be modulated. A smaller difference between the input data and the template data allows more STOs to operate at the same oscillation frequency and to exhibit synchronous vibration (i.e., synchronization) when the STOs are operated in parallel. The degree of matching is measured based on the degree of synchronization. Full synchronization indicates that two patterns in the input data and the template data are in perfect match.

As is known, the frequencies of the STOs are modulated by a current value or an external magnetic field (frequency non-linearity). The disclosed pattern matching devices utilize the current-based modulation of the oscillation frequencies of the STOs. Both the input data and the template data are assigned to voltage values provided to the STOs. The value of a current applied to each of the STOs is controlled to modulate the oscillation frequency of the STO. Each process of pattern matching needs an operation of assigning both the input data and the template data to voltage values and inputting the voltage values to the STO. Both the input data and the template data are treated as volatile, temporary data. The template data is based on data stored in a predetermined database. It is thus efficient to enable data stored in the database in a non-volatile manner to be utilized as template data. Enabling nonvolatile data to be utilized is particularly significant in view of increased speed and reduced power consumption.

DETAILED DESCRIPTION

According to an embodiment, a pattern matching device includes a plurality of unit cells, a circuit, and a measuring unit. Each of the plurality of unit cells includes a first magnetization reversal element used to store input data and including a first magnetic layer in which a direction of magnetization is variable and a first non-magnetic layer, a second magnetization reversal element used to store template data and including a second magnetic layer in which a direction of magnetization is variable and a second non-magnetic layer, and a spin-torque oscillator provided between the first magnetization reversal element and the second magnetization reversal element. The circuit is connected to the plurality of unit cells and applies a current to a selected spin-torque oscillator to acquire a high frequency signal from the selected spin-torque oscillator, the selected spin-torque oscillator being a spin-torque oscillator selected from a plurality of spin-torque oscillators in the plurality of unit cells. The measuring unit is configured to measure a degree of matching between the input data and the template data based on the high frequency signal.

Various embodiments will be described below with reference to the drawings. The embodiments relate to a pattern matching device that uses spin-torque oscillators (STOs) to evaluate the similarity of input data (input vector) to template data (template vector). In the embodiments below, like components are denoted by like reference numerals, and duplicate descriptions are omitted.

First Embodiment

Figure 1:
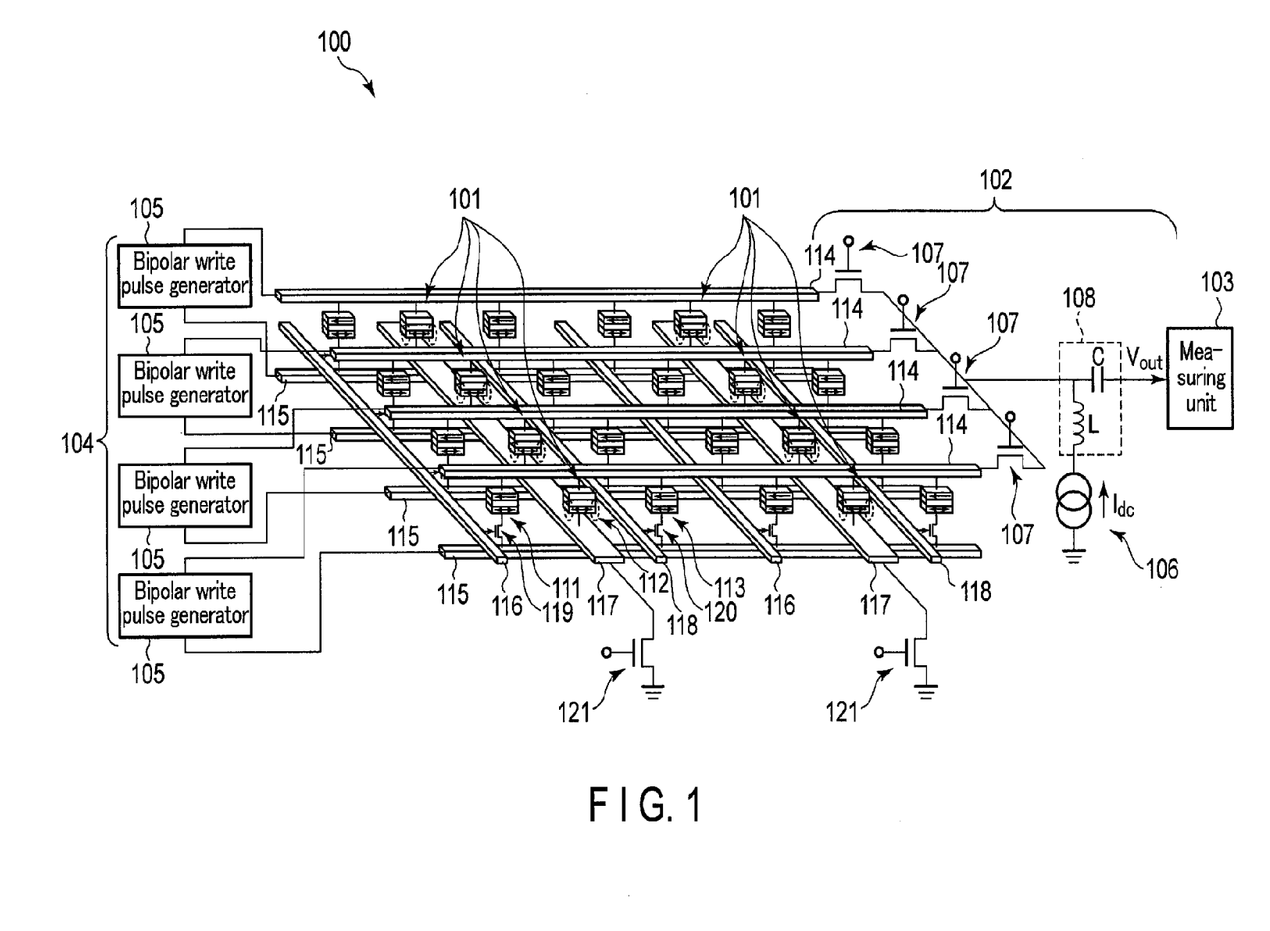
FIG. 1 is a diagram illustrating a pattern matching device according to a first embodiment.
Figure 2:
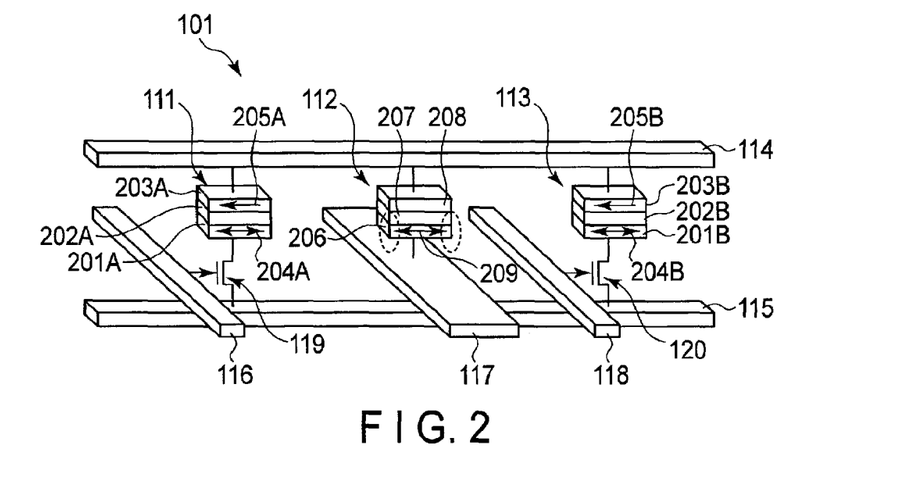
FIG. 2 is a perspective view illustrating one of the unit cells illustrated in FIG. 1.

FIG. 1 schematically illustrates a pattern matching device 100 according to a first embodiment. As illustrated in FIG. 1, the pattern matching device 100 includes a plurality of unit cells (also referred to as basic blocks) 101, a circuit 102, a measuring unit 103, and a current generator 104. In the example illustrated in FIG. 1, eight unit cells 101 are arranged in a matrix of 4 rows and 2 columns. FIG. 2 schematically illustrates one of the unit cells 101 illustrated in FIG. 1. The other unit cells 101 may be configured similarly to the unit cell 101 illustrated in FIG. 2.

The unit cell 101 illustrated in FIG. 2 includes a first magnetization reversal element 111, an STO 112, a second magnetization reversal element 113, row electrode wires 114 and 115 extending in a row direction, and column electrode wires 116, 117, and 118 in a column direction intersecting the row direction. The first magnetization reversal element 111, the STO 112, and the second magnetization reversal element 113 are arranged in the row direction. The STO 112 is provided between the first magnetization reversal element 111 and the second magnetization reversal element 113.

One end of the STO 112 is connected to the row electrode wire 114. The other end of the STO 112 is connected to the column electrode wire 117. One end of the first magnetization reversal element 111 is connected to the row electrode wire 114. The other end of the first magnetization reversal element 111 is connected to the column electrode wire 116. The column electrode wire 116 is provided with a transistor 119 that allows the first magnetization reversal element 111 to be selected. Specifically, the first magnetization reversal element 111 is connected to a drain (or source) of the transistor 119, the row electrode wire 115 is connected to a source (or drain) of the transistor 119, and the column electrode wire 116 is connected to a gate of the transistor 119. Turn-on and -off of the transistor 119 is controlled by the column electrode wire 116. One end of the second magnetization reversal element 113 is connected to the row electrode wire 114. The other end of the second magnetization reversal element 113 is connected to the column electrode wire 118. The column electrode wire 118 is provided with a transistor 120 that allows the second magnetization reversal element 113 to be selected. Specifically, the second magnetization reversal element 113 is connected to a drain (or source) of the transistor 120, the row electrode wire 115 is connected to a source (or drain) of the transistor 120, and the column electrode wire 118 is connected to a gate of the transistor 120. Turn-on and -off of the transistor 120 is controlled by the column electrode wire 118.

The STO 112 includes a magnetization oscillation layer 206, a magnetic layer 208, and a spacer layer 207 provided between the magnetization oscillation layer 206 and the magnetic layer 208. An electric current is applied to the STO 112 via the row electrode wire 114 and the column electrode wire 117. Applying a direct current to the STO 112 causes magnetization in the magnetization oscillation layer 206 to create the precession at a frequency corresponding to the value of the current. Specifically, electron's spins in the current is polarized by the magnetization in the magnetic layer 208. The spin-polarized current acts on magnetization 209 in the magnetization oscillation layer 206, thereby inducing precession of the magnetization 209 in the magnetization oscillation layer 206. This phenomenon is a phenomenon referred to as spin-transfer-torque magnetization oscillation. Element resistance varies momentarily as a result of the precession of the magnetization 209, generating a high frequency voltage at opposite ends of the STO 112.

The first magnetization reversal element 111 is used to store input data (input vector). The first magnetization reversal element 111 can store one bit of the input data. The first magnetization reversal element 111 includes a magnetization reversal layer 201A, a top layer 203A, and a non-magnetic layer 202A provided between the magnetization reversal layer 201A and the top layer 203A.

The magnetization reversal layer 201A is an in-plane magnetization film. In the present embodiment, in which the first magnetization reversal element 111, the STO 112, and the second magnetization reversal element 113 are arranged in the row direction, the magnetization reversal layer 201A has in-plane magnetic anisotropy in the row direction. In the row direction, a direction from the first magnetization reversal element 111 toward the second magnetization reversal element 113 is hereinafter referred to as a right direction. The opposite direction is hereinafter referred to as the left direction. Magnetization 204A in the magnetization reversal layer 201A faces in one of the right and left directions. The magnetization reversal layer 201A enables binary data represented by the direction of the magnetization 204A. For example, the left direction is associated with information "0", and the right direction is associated with information "1".

The top layer 203A is made of a ferromagnetic material. Magnetization 205A in the top layer 203A is desirably a pinned magnetization that is pinned in a predetermined direction in a plane. In the example illustrated in FIG. 2, the magnetization 205A in the top layer 203A is pinned in the left direction. The first magnetization reversal element 111 is structured similarly to what is called a spin-transfer-torque MRAM (Magnetoresistive Random Access Memory) cell.

In the first magnetization reversal element 111 structured as described above, application of a write current to the first magnetization reversal element 111 allows the magnetization 204A in the magnetization reversal layer 201A to be reversed. When the write current is applied to the first magnetization reversal element 111, spin-polarized electrons are injected from the top layer 203A into the magnetization reversal layer 201A. A spin torque acts on the magnetization 204A in the magnetization reversal layer 201A to reverse the magnetization 204A in the magnetization reversal layer 201A. When the magnetization 204A in the magnetization reversal layer 201A faces in a direction opposite to a direction in which the magnetization 205A in the top layer 203A faces, application of the write current in a direction from the magnetization reversal layer 201A toward the top layer 203A allows the magnetization 204A in the magnetization reversal layer 201A to be reversed. In contrast, when the magnetization 204A in the magnetization reversal layer 201A faces in the same direction as the direction in which the magnetization 205A in the top layer 203A faces, application of the write current in a direction from the top layer 203A toward the magnetization reversal layer 201A allows the magnetization 204A in the magnetization reversal layer 201A to be reversed.

The second magnetization reversal element 113 is used to store template data (template vector). The second magnetization reversal element 113 can store one bit of the template data. The second magnetization reversal element 113 may be structured similarly to the first magnetization reversal element 111. The second magnetization reversal element 113 includes a magnetization reversal layer 201B, a top layer 203B, and a non-magnetic layer 202B provided between the magnetization reversal layer 201B and the top layer 203B. The magnetization reversal layer 201B, the non-magnetic layer 202B, and the top layer 203B are similar to the above-described magnetization reversal layer 201A, non-magnetic layer 202A, and top layer 203A, and duplicate descriptions are omitted.

Figure 3:
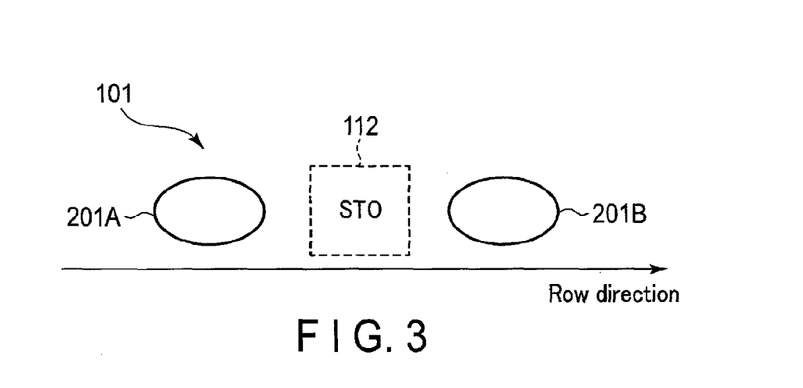
FIG. 3 is a diagram illustrating an example of the shape of a magnetization reversal layer illustrated in FIG. 2.
Figure 4:
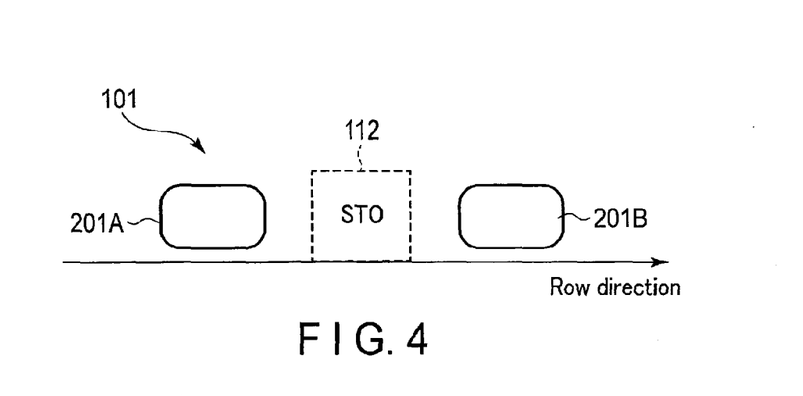
FIG. 4 is a diagram illustrating another example of the shape of the magnetization reversal layer illustrated in FIG. 2.

The magnetization reversal layers 201A and 201B have in-plane magnetic anisotropy in the row direction. The in-plane magnetic anisotropy can be applied by, for example, adjusting the shapes of the magnetization reversal layers 201A and 201B. FIG. 3 and FIG. 4 illustrate examples of the shapes of the magnetization reversal layers 201A and 201B where the unit cell 101 is viewed from above. The magnetization reversal layers 201A and 201B are processed into an elliptic shape with a major axis parallel to the row direction as illustrated in FIG. 3 or into a rectangular shape with a long side parallel to the row direction as illustrated in FIG. 4. Thus, the magnetization reversal layers 201A and 201B are provided with the in-plane magnetic anisotropy.

In the spin-transfer-torque MRAM cell, such a material as increases a magnetoresistive ratio of the element (for example, MgO, which is an insulator) is normally used as the non-magnetic layer. For the non-magnetic layers 202A and 202B in the present embodiment, any material may be used as long as the material causes a spin-transfer-torque magnetization reversal. For example, as a material for the non-magnetic layers 202A and 202B, a metallic material such as Cu (copper) may be used. How to configure the cell structures of magnetization reversal elements is generally known by those engaged in MRAMs and techniques similar to the MRAM technique.

In the pattern matching device 100 according to the present embodiment, the first magnetization reversal element 111 and the second magnetization reversal element 113 are structured similarly to cells in the spin-transfer-torque MRAM, referred to as the spin-RAM, as described above. The MRAM cell is nonvolatile. Therefore, in the pattern matching device 100 according to the present embodiment, the template data is stored in a nonvolatile manner.

When the unit cells 101 are arranged in a matrix as illustrated in FIG. 1, the unit cells 101 arranged in the row direction can share the row electrode wires 114 and 115. The unit cells 101 arranged in the column direction can share the column electrode wires 117 and 118. In the example in FIG. 1, four row electrode wires 114 are provided, and two unit cells 101 are connected to each of the row electrode wires 114. The row electrode wires 114 are connected to the circuit 102. For each of the column electrode wires 116, 117, and 118, two electrode wires are provided. Four first magnetization reversal elements 111 are connected to each of the column electrode wires 116. Four STOs 112 are connected to each of the column electrode wires 117. Four second magnetization reversal elements 113 are connected to each of the column electrode wires 118. The column electrode wire 117 is provided with a transistor 121 that allows selection of the column electrode wire 117 with the STOs 112 operated. The current generator 104 is connected to the row electrode wires 114 and the row electrode wires 115 and includes four bipolar write pulse generators 105 each of which applies the write current to the corresponding magnetization reversal element (first magnetization reversal element 111 or second magnetization reversal element 113).

The circuit 102 applies a current to a plurality of the STOs 112 to acquire a resultant high frequency voltage $V_{out}$. The circuit 102 connects to a direct current source 106 that supplies a direct current $I_{dc}$. The circuit 102 includes transistors 107 each of which allows selection of the corresponding row electrode wire 114 with the STOs 112 operated.

The plurality of STOs 112 to be operated are selected using the transistors 107 and 121. The circuit 102 applies a direct current to the selected STOs 112. The STOs 112 to which the current is applied form a parallel circuit with the STOs 112 connected together in parallel and simultaneously oscillate. A smaller difference between the input data and the template data allows more STOs 112 to oscillate at the same oscillation frequency, that is, to exhibit synchronous oscillation. The high frequency voltage $V_{out}$ acquired by the circuit 102 is an averaged output resulting from totaling of high frequency voltages output by the STOs 112 through which the current is applied. The high frequency voltage $V_{out}$ is retrieved by a bias tee 108 in the circuit 102 and provided to the measuring unit 103 as a high frequency signal. The degree of synchronization contained in the high frequency voltage $V_{out}$ is measured by the measuring unit 103 connected to the circuit 102. The degree of synchronization corresponds to the degree of matching between the input data and the template data.

Figure 5:
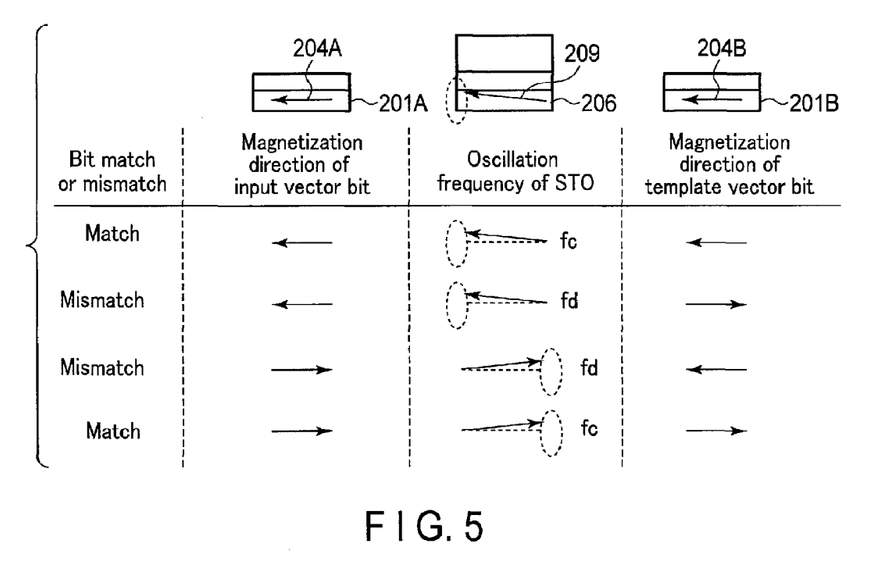
FIG. 5 is a diagram illustrating the principle of modulation of the oscillation frequency of a spin-torque oscillator according to an embodiment.

The oscillation frequency of each of the STOs 112 is modulated by stray magnetic fields from the first magnetization reversal element 111 and the second magnetization reversal element 113 adjacent to the STO 112. The magnitude of the stray magnetic fields depends on the direction of the magnetization 204A in the magnetization reversal layer 201A in the first magnetization reversal element 111 and the direction of the magnetization 204B in the magnetization reversal layer 201B in the second magnetization reversal element 113. With reference to FIG. 5, the principle of modulation of the oscillation frequency of the STO 112 will be described. FIG. 5 illustrates four cases of a combination of the direction of the magnetization 204A in the magnetization reversal layer 201A and the direction of the magnetization 204B in the magnetization reversal layer 201B, that is, (left, left), (left, right), (right, left), and (right, right).

(left, left) and (right, right) indicate cases where the magnetization direction of an input vector bit matches the magnetization direction of a template vector bit. (left, right) and (right, left) indicate cases where the magnetization direction of the input vector bit is different from the magnetization direction of the template vector bit (that is, the magnetization directions do not match). The magnetization oscillation layer 206 in the STO 112 is subjected to the effects of a stray magnetic field from the magnetization reversal layer 201A in the adjacent first magnetization reversal element 111 and a stray magnetic field from the magnetization reversal layer 201B in the adjacent second magnetization reversal element 113. In (left, left) or (right, right), a left or right stronger magnetic field acts on the magnetization oscillation layer 206 due to the constructive superposition of the two stray magnetic fields. In (left, right) or (right, left), the two stray magnetic fields are partly or completely canceled, and a magnetic field weaker than the magnetic field in the case of (left, left) or (right, right) acts on the magnetization oscillation layer 206. The oscillation frequency of the STO 112 depends on the magnitude of an external magnetic field. When no external magnetic field originally acts on the STO 112, the oscillation frequency of the STO 112 is fc in the case of (left, left) or (right, right) or fd in the case of (left, right) or (right, left). The oscillation frequency of the STO 112 is determined by the magnitude of a superposed stray magnetic field corresponding to the difference between the input vector bit and the template vector bit. When an external magnetic field with a certain magnitude (for example, a stray magnetic field from the magnetic layer 208) originally acts on the magnetization oscillation layer 206 and the STO 112 oscillates at an oscillation frequency f0 with no stray magnetic field from the vector bit (in other words, the free-running oscillation frequency of the STO 112 is f0), the oscillation frequency of the STO 112 is f0−Δfc in the case of (left, left), f0+Δfc in the case of (right, right), f0−Δfd in the case of (left, right), or f0+Δfd in the case of (right, left). Symbols Δfc and Δfd each denote the amount of modulation of the oscillation frequency of the STO 112 resulting from the overlapping stray magnetic fields corresponding to the difference between the input data and the template data. Thus, the oscillation frequency of the STO 112 is determined by the magnitude of the superposed stray magnetic field corresponding to the difference between the input vector bit and the template vector bit. The term "match" and "not match" used above does not necessarily mean match and mismatch between data. This is because how data is represented by the direction of the vector bit depends on a coding rule.

When the input data and the template data are in perfect match (that is, perfect pattern match), all the STOs 112 are in the same oscillation environment and exhibit synchronous oscillation in which all the STOs 112 oscillate at the same frequency. A method for determining whether the STOs 112 exhibit full or partial synchronization is to acquire a high frequency signal for each of a number of previously known sets of input data and template data and identify the characteristics of the high frequency signals. For example, the full synchronization may result in a high-coherent signal $V_{out}$ with a specific frequency. When the signal $V_{out}$ has such a characteristic, a bandpass filter that allows signals with the specific frequency to selectively pass through may be provided in the circuit of the measuring unit 103 to determine whether or not the full synchronization has been established.

When components related to the STOs 112 are neglected, as described above, the structure of the pattern matching device 100 is similar to the basic structure of the spin-transfer-torque MRAM referred to as the spin-RAM. In a form adopted for a write operation performed on the magnetizations 204 and 204B, the transistor 107 or 121 is turned on to select the magnetization reversal element, and the bipolar write pulse generator 105 is simultaneously operated. This is the same as a write operation performed by the spin-transfer-torque MRAM. A difference from the spin-transfer-torque MRAM lies in a read operation (pattern matching). In the present embodiment, the STO 112 is used to compare each bit of the template data with the corresponding bit of the input data written to the magnetizations 204A and 204B as described above to determine the difference between the data. Furthermore, unlike in the spin-transfer-torque MRAM, a large number of cells are referenced at a time, that is, in a massively parallel way, to compare the input data with the template data to determine the difference between the data.

Now, an operation example of the pattern matching device 100 will be described.

First, the template data is stored in the second magnetization reversal element 113. For example, when the pattern matching device 100 is utilized for image recognition, data on images to be matched (for example, 10,000 images) is stored in the second magnetization reversal element 113. At this time, the image data is desirably stored in accordance with a predetermined data arrangement rule. For example, the image data is standardized into 320×240 pixel data, and pixels are stored in the second magnetization reversal element 113 starting with a lower left pixel.

The template data is written as follows. To allow selection of the second magnetization reversal element 113 on which a write operation is to be performed, the transistor 120 is turned on. In this state, the bipolar write pulse generator 105 is operated to perform spin-transfer-torque magnetization reversal on the selected second magnetization reversal element 113. The direction (left direction or right direction) of magnetization is determined by the polarity of the bipolar write pulse generator 105.

Subsequently, the input data is loaded and stored in the first magnetization reversal element 111. This process is referred to as loading of the input data. In this case, the input data needs to follow the same data arrangement rule as that which is obeyed by the template data. The loading and storage need to be based on a leading address of the target template data.

The input data is written as follows. To allow the write target first magnetization reversal element 111 to be selected, the transistor is turned on. In this state, the bipolar write pulse generator 105 is operated. The bipolar write pulse generator 105 is operated in the above-described state to perform spin-transfer-torque magnetization reversal on the selected second magnetization reversal element 113. The direction (left direction or right direction) of magnetization is determined by the polarity of the bipolar write pulse generator 105.

Then, the plurality of STOs 112 selected by the transistors 107 and 121 are operated to determine data matching using the measuring unit 103. This process is referred to as matching determination. Specifically, a direct current is applied to the selected STOs 112, and based on the resultant high frequency signal $V_{out}$, the measuring unit 103 measures the degree of matching between the input data and the template data.

In a basic operation, the loading of the input data and the matching determination are repeatedly performed on each of the images to be matched (for example, 10,000 images).

In the pattern matching device 100 according to the present embodiment, the input data is stored in the magnetization reversal layer 201A in the first magnetization reversal element 111, the template data is stored in the magnetization reversal layer 201B in the second magnetization reversal element 113, and the oscillation frequency of the STO 112 is controlled based on the magnitude of the stray magnetic fields from the magnetization reversal layers 201A and 201B as described above. The direction of the magnetization in the magnetic material is nonvolatile, and thus, the template vector is stored in a nonvolatile manner.

Second Embodiment

Figure 6:
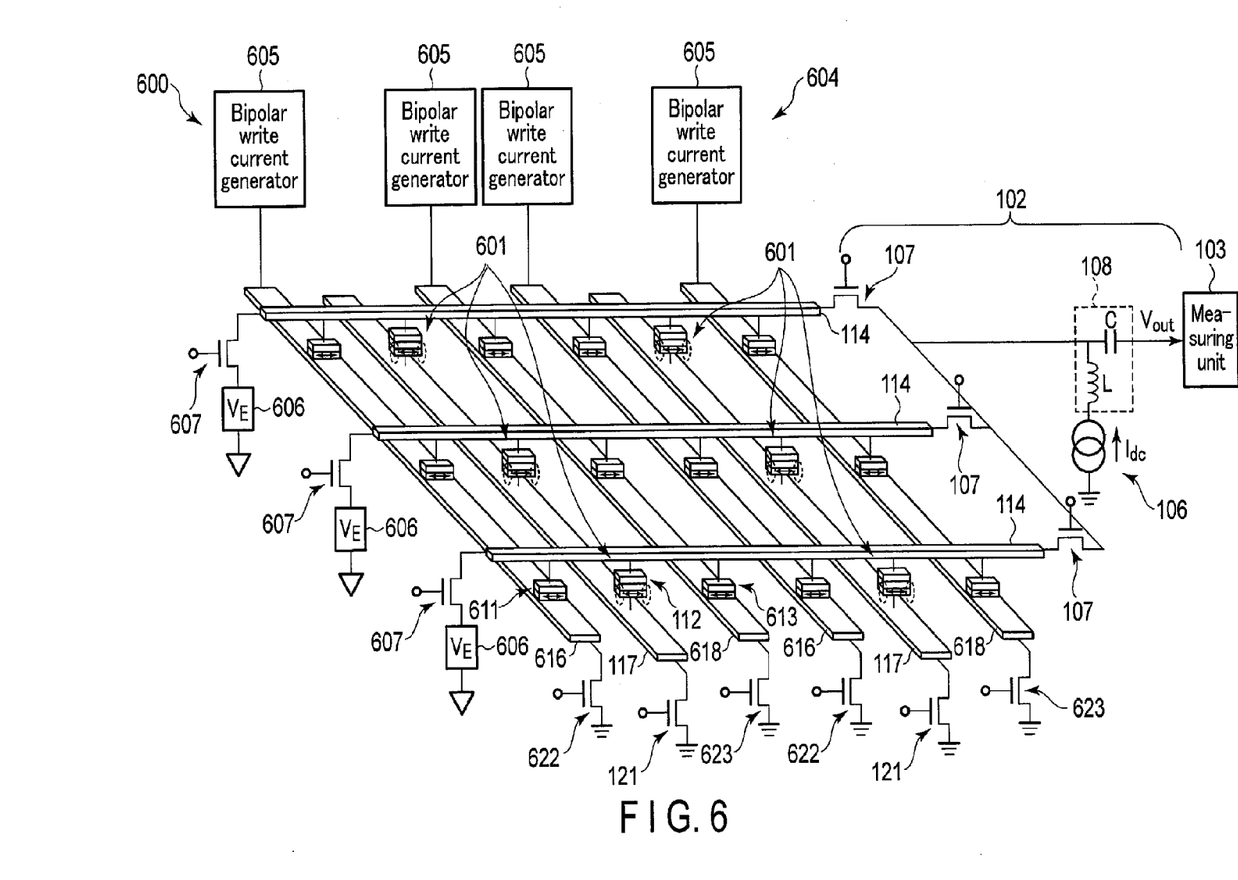
FIG. 6 is a diagram illustrating a pattern matching device according to a second embodiment.
Figure 7:
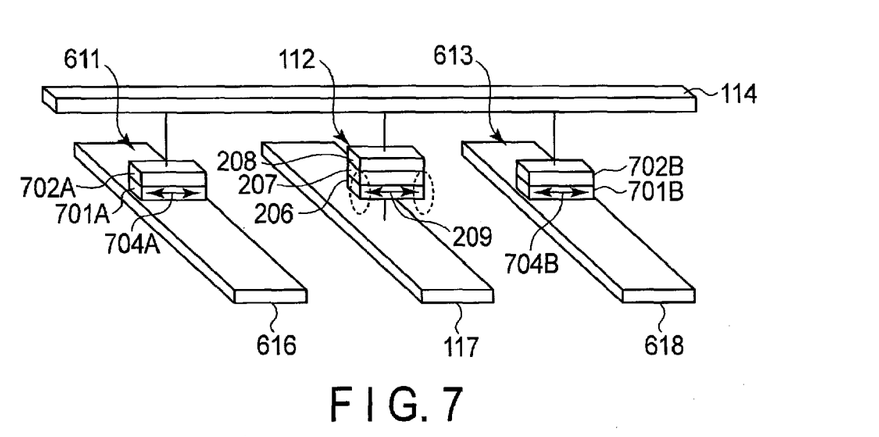
FIG. 7 is a perspective view illustrating one of the unit cells illustrated in FIG. 6.

FIG. 6 schematically illustrates a pattern matching device 600 according to a second embodiment. As illustrated in FIG. 6, the pattern matching device 600 includes a plurality of unit cells 601, a circuit 102, a measuring unit 103, a current generator 604, and voltage sources 606. The circuit 102 and the measuring unit 103 have been described in the first embodiment and will thus not be described below. In an example in FIG. 6, six unit cells 601 are arranged in a matrix of three rows and two columns. FIG. 7 schematically illustrates one of the unit cells 601 illustrated in FIG. 6. The other unit cells 601 may be configured similarly to the unit cell 601 illustrated in FIG. 6.

The unit cell 601 illustrated in FIG. 7 includes a first magnetization reversal element 611, an STO 112, a second magnetization reversal element 613, a row electrode wire 114 extending in the row direction, and column electrode wires 616, 117, and 618 extending in a column direction intersecting the row direction. The first magnetization reversal element 611, the STO 112, and the second magnetization reversal element 613 are arranged in the row direction. The STO 112 is provided between the first magnetization reversal element 611 and the second magnetization reversal element 613. The STOs 112 have been described in the first embodiment and will thus not be described below.

One end of the STO 112 is connected to the row electrode wire 114. The other end of the STO 112 is connected to the column electrode wire 117. One end of the first magnetization reversal element 611 is connected to the row electrode wire 114. The other end of the first magnetization reversal element 611 is connected to the column electrode wire 616. One end of the second magnetization reversal element 613 is connected to the row electrode wire 114. The other end of the second magnetization reversal element 613 is connected to the column electrode wire 618.

The first magnetization reversal element 611 is used to store input data. The first magnetization reversal element 611 includes a magnetization reversal layer 701A in which a direction of magnetization 704A is variable and a non-magnetic layer 702A stacked on the magnetization reversal layer 701A and made of an insulating material. The magnetization reversal layer 701A is similar to the magnetization reversal layer 201A (show in FIG. 2) described in the first embodiment, and thus, description of the magnetization reversal layer 701A is omitted as needed. A surface of the first magnetization reversal element 611 on the magnetization reversal layer 701A side is in contact with the column electrode wire 616.

The second magnetization reversal element 613 is used to store template data. The second magnetization reversal element 613 includes a magnetization reversal layer 701B in which a direction of magnetization 704B is variable and a non-magnetic layer 702B stacked on the magnetization reversal layer 701B and made of an insulating material. The magnetization reversal layer 701B is similar to the magnetization reversal layer 201A (shown in FIG. 2) described in the first embodiment, and thus, description of the magnetization reversal layer 701B is omitted as needed. A surface of the second magnetization reversal element 613 on the magnetization reversal layer 701B side is in contact with the column electrode wire 618.

When the unit cells 601 are arranged in a matrix as illustrated in FIG. 6, the unit cells 601 arranged in the row direction can share the row electrode wire 114. The unit cells 601 arranged in the column direction can share the column electrode wires 616, 117, and 618. In the example in FIG. 6, three row electrode wires 114 are provided, and two unit cells 601 are connected to each of the row electrode wires 114. Each of the row electrode wires 114 is connected to the circuit 102 and to the voltage source 606 via a transistor 607. Each of the voltage sources 606 generates a voltage $V_E$ in order to exert a field effect on magnetization 704A in the first magnetization reversal element 611 or magnetization 704B in the second magnetization reversal element 613, in the unit cell 601 connected to the corresponding row electrode wire 114.

For each of the column electrode wires 616, 117, and 618, two electrode wires are provided. Three first magnetization reversal elements 611 are connected to each of the column electrode wires 616. Three STOs 112 are connected to each of the column electrode wires 117. Three second magnetization reversal elements 113 are connected to each of the column electrode wires 618. One end of the column electrode wire 616 is connected to a bipolar write current generator 605 that generates a write current. The other end of the column electrode wire 616 is grounded via a transistor 622. One end of the column electrode wire 618 is connected to a bipolar write current generator 605 that generates a write current. The other end of the column electrode wire 618 is grounded via a transistor 623. The current generator 604 includes the bipolar write pulse generators 605. The column electrode wire 117 is provided with a transistor 121 that allows selection of the column electrode wire 117 with the STOs 112 operated.

In the present embodiment, writing of input data to the first magnetization reversal element 611 and writing of template data to the second magnetization reversal element 613 are performed based on a combination of a spin Hall effect and a field effect. When components related to the STOs 112 are neglected, the pattern matching device 600 is configured similarly to a type of spin-transfer-torque MRAM that is sometimes referred to as a spin Hall memory.

The input data is written as follows. To allow the write target first magnetization reversal element 611 to be selected, selection of the column electrode wire 616 (operation of the transistor 622) and selection of the row electrode wire 114 (operation of the transistor 607) are performed. In this state, the bipolar write current generator 605 is operated. Similarly, the template data is written as follows. To allow the write target second magnetization reversal element 613 to be selected, selection of the column electrode wire 618 (operation of the transistor 623) and selection of the row electrode wire 114 (operation of the transistor 607) are performed. In this state, the bipolar write current generator 605 is operated.

When the transistor 607 is operated, the in-plane magnetic anisotropy of the magnetization reversal layer 701A or the magnetization reversal layer 701B is reduced due to an electric field effect. In this state, the bipolar write current generator 605 is operated to apply a current to the selected column electrode wire to perform magnetization reversal based on the spin Hall torque, or spin-orbit torque, on the magnetization 704A in the magnetization reversal layer 701A or the magnetization 704B in the magnetization reversal layer 701B. Whether the magnetization is in the right direction or the left direction is determined by the polarity of the bipolar write current generator 605. To allow the magnetization reversal based on the spin Hall effect to be effectively achieved, the column electrode wires, 616 and 618, are desirably made of a material with a high spin Hall effect, for example, Rh or Pd that is a 4d transition metal, Ta, W, Re, Os, or Pt that is a 5d transition metal, or an alloy containing at least one of these metals.

Pattern matching on the input data and the template data written using the above-described method is executed by operating the transistors 107 and 121 and the circuit 102 to oscillate a selected plurality of STOs 112.

As described above, the pattern matching device according to the second embodiment allows the template vector to be stored in a nonvolatile manner.

In the above-described embodiments, the unit cells, 101 or 601, are arranged in a matrix. However, the arrangement of the unit cells, 101 or 601, is not limited to the matrix form. For example, the unit cells, 101 or 601, may be arranged in a line. Moreover, the wiring pattern is not limited to the examples described in the embodiments. For example, the circuit 102 may be connected to the column electrode wires 117.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern matching device comprising:
   a plurality of unit cells, each of the plurality of unit cells comprising:
      a first magnetization reversal element used to store input data and including a first magnetic layer in which a direction of magnetization is variable and a first non-magnetic layer;
      a second magnetization reversal element used to store template data and including a second magnetic layer in which a direction of magnetization is variable and a second non-magnetic layer; and a spin-torque oscillator provided between the first magnetization reversal element and the second magnetization reversal element;

a circuit which is connected to the plurality of unit cells and applies a current to a selected spin-torque oscillator to acquire a high frequency signal from the selected spin-torque oscillator, the selected spin-torque oscillator being a spin-torque oscillator selected from a plurality of spin-torque oscillators in the plurality of unit cells; and a measuring unit configured to measure a degree of matching between the input data and the template data based on the high frequency signal.

2. The device according to claim 1, wherein the plurality of unit cells are arranged in a matrix, and each of the plurality of unit cells further comprises:

a first electrode wire extending in a first direction and connected to the first magnetization reversal element, the second magnetization reversal element, and the spin-torque oscillator;

a second electrode wire extending in a second direction different from the first direction and connected to the first magnetization reversal element;

a third electrode wire extending in the second direction and connected to the spin-torque oscillator; and a fourth electrode wire extending in the second direction and connected to the second magnetization reversal element.

3. The device according to claim 2, wherein the first magnetic layer and the second magnetic layer have in-plane magnetic anisotropy in the first direction.

4. The device according to claim 1, wherein the first magnetization reversal element further includes a first top layer comprising a ferromagnetic material, the first non-magnetic layer is provided between the first magnetic layer and the first top layer, the second magnetization reversal element further includes a second top layer comprising a ferromagnetic material, the second non-magnetic layer is provided between the second magnetic layer and the second top layer, and the device further comprises a current generator which is connected to the plurality of unit cells and applies a current to a magnetization reversal element to reverse a magnetization in the magnetization reversal element, the magnetization reversal element being selected from a plurality of first magnetization reversal elements and a plurality of second magnetization reversal elements in the plurality of unit cells.

5. The device according to claim 2, wherein the first non-magnetic layer comprises an insulating material, the second non-magnetic layer comprises an insulating material, the second electrode wire is in contact with a surface of the first magnetization reversal element on the first magnetic layer side, and the fourth electrode wire is in contact with a surface of the second magnetization reversal element on the second magnetic layer side, the device further comprises:

a current generator which is connected to the second electrode wire and the fourth electrode wire and applies a current to a magnetization reversal element to reverse a magnetization in the magnetization reversal element, the magnetization reversal element being selected from a plurality of first magnetization reversal elements and a plurality of second magnetization reversal elements in the plurality of unit cells; and a voltage source which generates a voltage allowing a field effect to be exerted on magnetization in the magnetization reversal element.

6. The device according to claim 5, wherein the second electrode wire and the fourth electrode wire comprise Rh, Pd, Ta, W, Re, Os, or Pt, or an alloy containing at least one of Rh, Pd, Ta, W, Re, Os, and Pt.

7. The device according to claim 3, wherein the first non-magnetic layer comprises an insulating material, the second non-magnetic layer comprises an insulating material, the second electrode wire is in contact with a surface of the first magnetization reversal element on the first magnetic layer side, and the fourth electrode wire is in contact with a surface of the second magnetization reversal element on the second magnetic layer side, the device further comprises:

a current generator which is connected to the second electrode wire and the fourth electrode wire and applies a current to a magnetization reversal element to reverse a magnetization in the magnetization reversal element, the magnetization reversal element being selected from a plurality of first magnetization reversal elements and a plurality of second magnetization reversal elements in the plurality of unit cells; and a voltage source which generates a voltage allowing a field effect to be exerted on magnetization in the magnetization reversal element.

8. The device according to claim 7, wherein the second electrode wire and the fourth electrode wire comprise Rh, Pd, Ta, W, Re, Os, or Pt, or an alloy containing at least one of Rh, Pd, Ta, W, Re, Os, and Pt.

\* \* \* \* \*